United States Patent
Paek et al.

(10) Patent No.: US 7,335,986 B1
(45) Date of Patent: Feb. 26, 2008

(54) WAFER LEVEL CHIP SCALE PACKAGE

(75) Inventors: Jong Sik Paek, Seoul (KR); Sung Su Park, Seoul (KR); Ho Cheol Jang, Seoul (KR); Jung Gi Jin, Jeju-do (KR)

(73) Assignee: Amkor Technology, Inc., Chandler, AZ (US)

( * ) Notice: Subject to any disclaimer, the term of this patent is extended or adjusted under 35 U.S.C. 154(b) by 171 days.

(21) Appl. No.: 11/227,410

(22) Filed: Sep. 14, 2005

(51) Int. Cl.
*H01L 23/34* (2006.01)

(52) U.S. Cl. .................. 257/723; 257/724; 257/725

(58) Field of Classification Search ................ 257/724, 257/725, 723, 737, 738, 759, 762, 777, 778
See application file for complete search history.

(56) References Cited

U.S. PATENT DOCUMENTS

| | | | |
|---|---|---|---|
| 6,690,583 B1 | 2/2004 | Bergstedt et al. | 361/763 |
| 7,189,594 B2* | 3/2007 | Kripesh et al. | 438/107 |
| 2005/0085006 A1* | 4/2005 | Voelz | 438/106 |
| 2006/0030070 A1* | 2/2006 | Leu et al. | 438/106 |

* cited by examiner

*Primary Examiner*—Thao P. Le
(74) *Attorney, Agent, or Firm*—Gunnison, McKay & Hodgson, L.L.P.; Serge J. Hodgson

(57) ABSTRACT

Disclosed is a wafer level chip scale package and a method for manufacturing the same. The wafer level chip scale package includes a semiconductor die having a first coating layer formed thereon; a redistribution layer formed on the first coating layer and connected to the bond pad; an electronic device placed on the first coating layer; a connection member for electrically connecting the electronic device and the redistribution layer; a conductive post formed on the redistribution layer with a predetermined thickness; a second coating layer for enclosing the first coating layer, the redistribution layer, the electronic device, the connection member, and the conductive post; and a solder ball thermally bonded to the conductive post while protruding to the exterior of the second coating layer. This construction makes it easy to manufacture stacked packages and chip scale packages in a wafer level.

20 Claims, 14 Drawing Sheets

WAFER LEVEL CHIP SCALE PACKAGE

BACKGROUND OF THE INVENTION

1. Field of the Invention

The present invention relates to a wafer level chip scale package and a method for manufacturing the same.

2. Description of Related Art

In general, a wafer level package refers to a package in which the entire packaging process is completed in a wafer condition and has a size similar to that of a semiconductor die. The wafer level package has shortened manufacturing processes and reduced amount of materials used for semiconductor assembly. This decreases the manufacturing cost.

The wafer level package includes a semiconductor die, a substrate electrically connected to the semiconductor die, an encapsulant for encapsulating the semiconductor die, and a solder ball formed on a side of the substrate to be mounted on an external apparatus. A method for manufacturing the wafer level package includes the operations of bonding a substrate having a number of wiring patterns formed thereon to a wafer while electrically connecting each semiconductor die of the wafer to each unit of the substrate, forming a solder ball on a side of the substrate, encapsulating each semiconductor die of the wafer and the substrate, and sawing the semiconductor die and the substrate together from the wafer into a separate package.

However, such a conventional wafer level package and a method for manufacturing the same have a problem in that only one semiconductor die is positioned on a package and the memory capacity or functions cannot be improved dramatically. For example, it is difficult to integrate two or more memory chips, a memory chip and a DSP (Digital Signal Processor), or a memory chip and a PLC (Programmable Logic Controller) into a package. As a result, the current trend towards developing a package with a larger capacity and more functions cannot be met.

The conventional wafer level package uses an expensive substrate, which increases the manufacturing cost. Furthermore, the semiconductor die and the substrate must be precisely aligned with each other during manufacturing processes to be bonded to each other with an adhesive. This makes the processes complicated and difficult.

BRIEF SUMMARY OF THE INVENTION

In accordance with one embodiment, a wafer level chip scale package and a method for manufacturing the same is presented. The wafer level chip scale package includes a semiconductor die having a first coating layer formed thereon; a redistribution layer formed on the first coating layer and connected to the bond pad; an electronic device placed on the first coating layer; a connection member for electrically connecting the electronic device and the redistribution layer; a conductive post formed on the redistribution layer with a predetermined thickness; a second coating layer for enclosing the first coating layer, the redistribution layer, the electronic device, the connection member, and the conductive post; and a solder ball thermally bonded to the conductive post while protruding to the exterior of the second coating layer. This construction makes it easy to manufacture stacked packages and chip scale packages in a wafer level.

The present invention will be more apparent from the following detailed description taken in conjunction with the accompanying drawings.

BRIEF DESCRIPTION OF THE DRAWINGS

Common reference numerals are used throughout the drawings and the detailed description to indicate the same elements.

DETAILED DESCRIPTION

Figure 1:
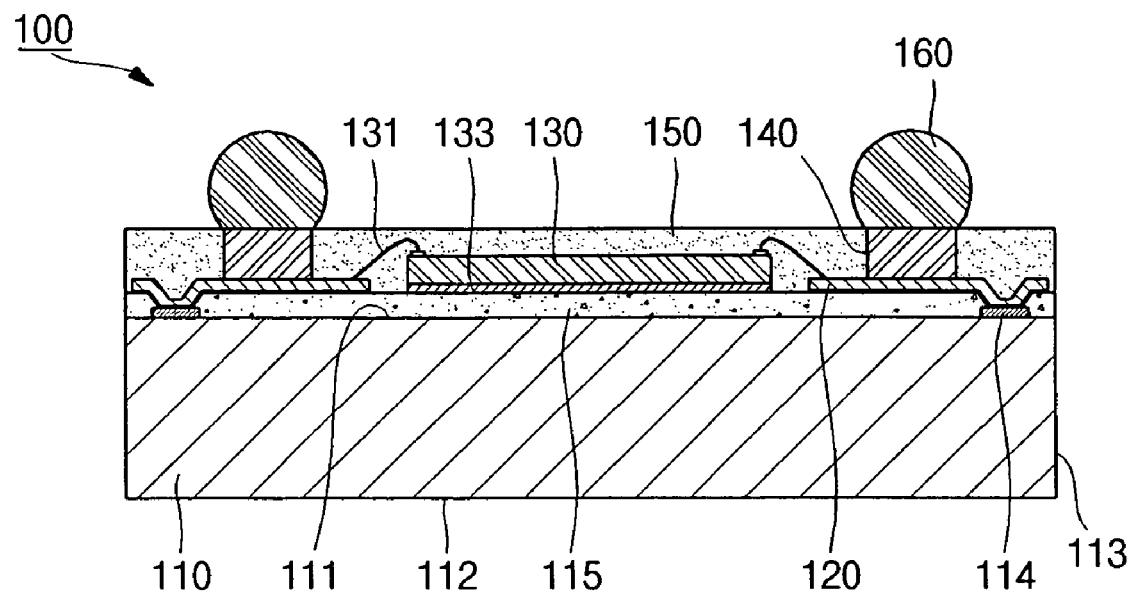
FIG. 1 is a sectional view showing a wafer level chip scale package according to an embodiment of the present invention.

Referring to FIG. 1, a sectional view showing a wafer level chip scale package according to an embodiment of the present invention is illustrated.

As shown, a wafer level chip scale package 100 according to the present invention includes a semiconductor die 110 having a bond pad 114 and a first coating layer 115; a first redistribution layer 120 formed on the first coating layer 115 while being connected to the bond pad 114; a first electronic device 130 positioned on the first coating layer 115 while being connected to the first redistribution layer 120; a first conductive post 140 formed on the first redistribution layer 120 with a predetermined thickness; a second coating layer 150 for covering the first coating layer 115, the first electronic device 130, the first redistribution layer 120, and the first conductive post 140; and a solder ball 160 thermally bonded to the first conductive post 140.

The semiconductor die 110 has a substantially planar first surface 111, a substantially planar second surface 112 opposing the first surface 111, and a substantially planar third surface 113 positioned along the periphery of the first and second surfaces 111 and 112 while being substantially perpendicular to them. Although the terms parallel, perpendicular and the like are used herein, it is understood that the elements may not be exactly parallel or perpendicular but only parallel or perpendicular to within acceptable manufacturing tolerances. The second and third surfaces 112 and 113 of the semiconductor die 110 are completely exposed to the exterior for excellent radiation performance of the package. The semiconductor die 110 has the same width as that of the first and second coating layers 115 and 150 to realize a true chip scale package. The semiconductor die 110 has at least one bond pad 114 formed on the first surface 111. The entire first surface 111 of the semiconductor die 110 is coated with the first coating layer 115 with a predetermined thickness, except for the bond pad 114. The first coating layer 115 is different from a protective layer (nitride or oxide layer, not shown in the drawing) formed on the first surface 111 of the semiconductor die 110 in a wafer fabrication process and is separately formed in a packaging process. The first coating layer 115 is suitably made of a photosensitive material so that the bond pad 114 is easily exposed in the packaging process by an exposure-to-light, development, or etching process. For example, the first coating layer 115 may be made of any one chosen from BCB (benzocyclobutene), PI (polyimide), and an equivalent thereof, but the material is not limited in the present invention. The BCB or PI has many advantages in the wafer level chip scale package field as in the present invention: easy process, low dielectric constant, thermal stability in excess of subsequent processing and repair operations, good adhesion to the semiconductor die and first redistribution layer, low stress formation, low water absorption, stress buffer and passivation.

A region of the first redistribution layer 120 is connected to the bond pad 114 and another region thereof extends a predetermined distance along the surface of the first coating layer 115. Particularly, the first redistribution layer 120 is rewired on the first coating layer 115 in a predetermined shape with a region thereof connected to the bond pad 114. The first redistribution layer 120 may be made of any one chosen from copper (Cu), aluminum (Al), and other various alloys, but the material is not limited herein.

The first electronic device 130 is bonded to the surface of the first coating layer 115 with an adhesive 133 and is electrically connected to the first redistribution layer 120 by a first connection member 131. The first electronic device 130 may be a semiconductor die, such as a memory, a DSP, or a PLC, but the type is not limited herein. The first connection member 131 may be a conductive wire such as a conventional gold wire, an aluminum wire, or a copper wire, but the material is not limited herein.

The first conductive post 140 is formed on the first redistribution layer 120 with a predetermined thickness in a direction substantially perpendicular to the longitudinal direction of the first redistribution layer 120. The first conductive post 140 has a thickness slightly larger than that of the first redistribution layer 120, but the thickness is not limited in the present invention. The topmost end of the first conductive post 140 is suitably higher than that of the first connection member 131. Otherwise, the first connection member 131 would be exposed to the exterior of the second coating layer 150 which is substantially flush with the topmost end of the first conductive post 140. The first conductive post 140 may be made of any one chosen from copper (Cu), aluminum (Al) and other various alloys, but the material is not limited herein.

The second coating layer 150 covers the first coating layer 115, the first redistribution layer 120, the first electronic device 130, the first connection member 131, and the first conductive post 140 and protects them from external environments. The surface of the first conductive post 140 is flush with the surface of the second coating layer 150 so that, before the solder ball 160 is thermally bonded, the surface of the first conductive post 140 is exposed via the second coating layer 150. The second coating layer 150 may be made of any one chosen from mold compound, epoxy resin, and an equivalent thereof, in addition to BCB (benzocyclobutene) and PI (polyimide), but the material is not limited herein. Suitably, the second coating layer 150 is made of mold compound or liquid epoxy resin so that it can be simply formed using a mold or dispenser without exposure-to-light, development, and etching processes.

The solder ball 160 is thermally bonded to the surface of the first conductive post 140 exposed via the second coating layer 150. The solder ball 160 makes it possible to mount the wafer level chip scale package 100 according to the present invention on an external apparatus. However, the wafer level chip scale package 100 according to the present invention can also be mounted on an external apparatus without the solder ball 160. Particularly, the wafer level chip scale package 100 can be simply mounted on an external apparatus by previously applying a solder paste to the first conductive post 140 or the external apparatus and causing it to reflow at a high temperature while the wafer level chip scale package 100 is aligned with the external apparatus.

Figure 1A:
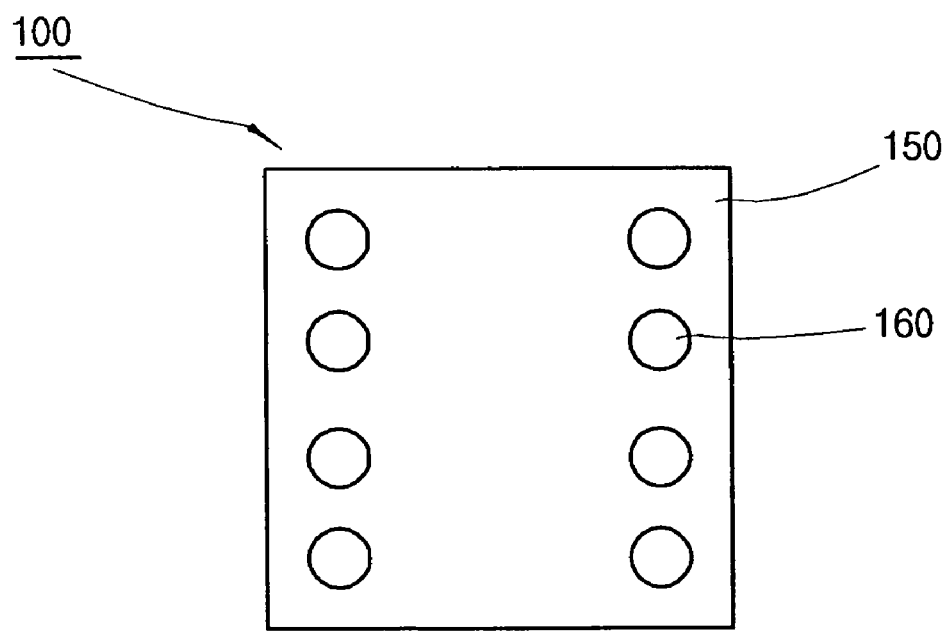
FIG. 1A is a top view of the wafer level chip scale package shown in FIG. 1.
Figure 1B:
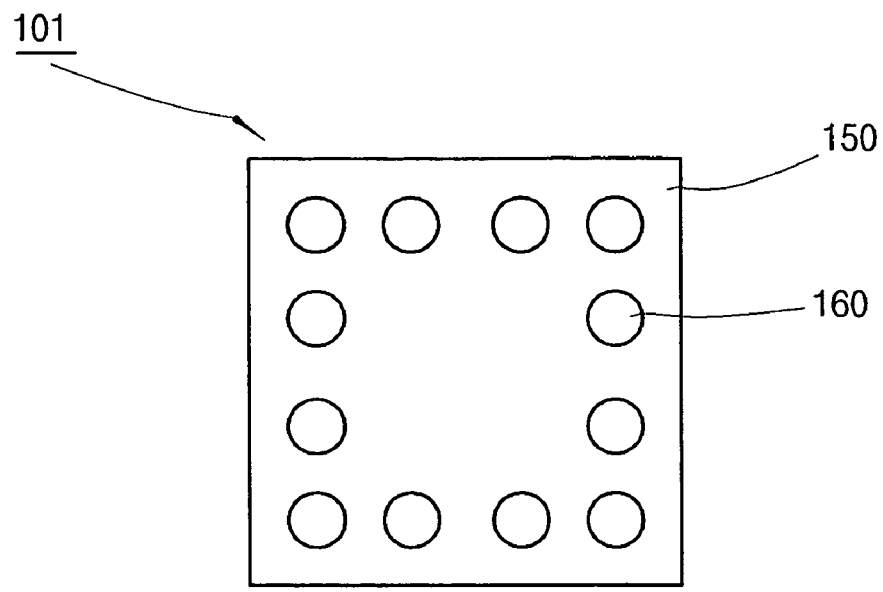
FIG. 1B is a top view showing a wafer level chip scale package according to another embodiment of the present invention.

Referring to FIG. 1A, a top view of the wafer level chip scale package shown in FIG. 1 is illustrated, and referring to FIG. 1B, a top view showing a wafer level chip scale package according to another embodiment of the present invention is illustrated.

As shown in FIG. 1A, the solder ball 160 of the wafer level chip scale package 100 may be arrayed with dual type on the second coating layer 150. Moreover, as shown in FIG. 1B, the solder ball 160 of a wafer level chip scale package 101 may be arrayed with quad type on the second coating layer 150. Of course, the first conductive post (not shown) must be arrayed with a dual or quad type for the dual or quad type array of the solder ball 160.

Figure 2:
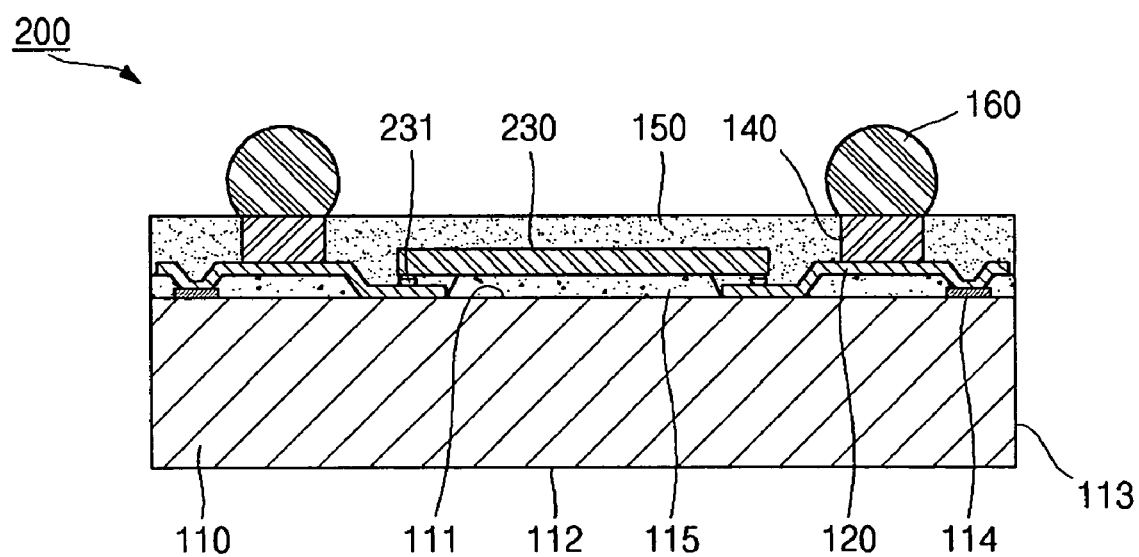
FIG. 2 is a sectional view showing a wafer level chip scale package according to another embodiment of the present invention.

Referring to FIG. 2, a sectional view showing a wafer level chip scale package according to another embodiment of the present invention is illustrated.

The package 200 has a structure similar to that of the package 100 shown in FIG. 1 and the difference between them will now be described.

As shown, the first redistribution layer 120 has a region connected to the bond pad 114, another region formed on the first coating layer 115, and still another region directly formed on the first surface ill of the semiconductor die 110. Alternatively, a region of the first redistribution layer 120 may be connected to the bond pad 114 and all other regions formed on the first coating layer 115.

A first electronic device 230 is directly seated on the first coating layer 115 in the central region of the first surface 111 of the semiconductor die 110 without any adhesive. The first electronic device 230 may be a semiconductor die, such as a memory, a DSP, or a PLC, but the type is not limited herein. Although the first electronic device 230 is covered with the second coating layer 150, it may have a region exposed to the exterior of the second coating layer 150 for improved radiation performance.

The first electronic device 230 is electrically and mechanically connected to the first redistribution layer 120 by a first connection member 231, such as a conductive bump. This type of connection is generally referred to as a flip chip connection. The conductive bump constituting the first connection member 231 may be any one chosen from a solder bump, a gold bump, a silver bump, and other various alloys, but the material is not limited herein.

Figure 3:
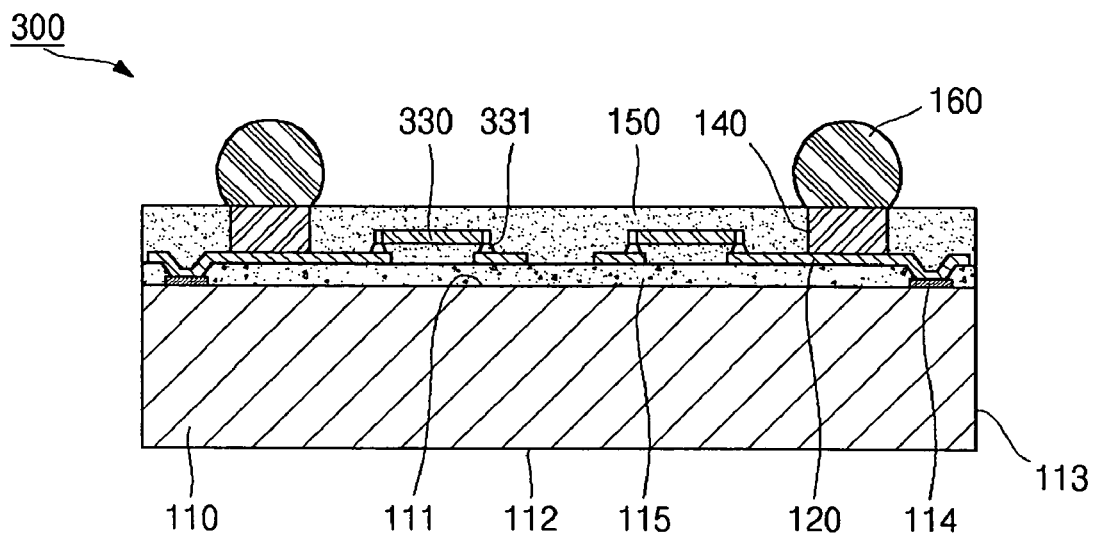
FIG. 3 is a sectional view showing a wafer level chip scale package according to another embodiment of the present invention.

FIG. 3 is a sectional view showing a wafer level chip scale package according to another embodiment of the present invention.

The package 300 has a structure similar to that of the package 200 shown in FIG. 2 and the difference between them will now be described.

As shown, a region of the first redistribution layer 120 is connected to the bond pad 114 and all other regions are formed on the first coating layer 115. The first redistribution layer 120 may also have a region directly formed on the first surface 111 of the semiconductor die 110, as mentioned above.

A first electronic device 330 is electrically and mechanically connected to the first redistribution layer 120 on the first coating layer 115 by a conductive body 331 without any adhesive. The conductive body 331 may be made of any one chosen from conventional solder, gold, silver, and other various alloys, but the material is not limited herein. The first electronic device 330 may be any one chosen from a conventional resistor, capacitor, and an equivalent thereof, but the type is not limited herein. Although the first electronic device 330 is covered with the second coating layer 150, it may be exposed to the exterior of the second coating layer 150 for improved radiation performance.

Figure 4A:
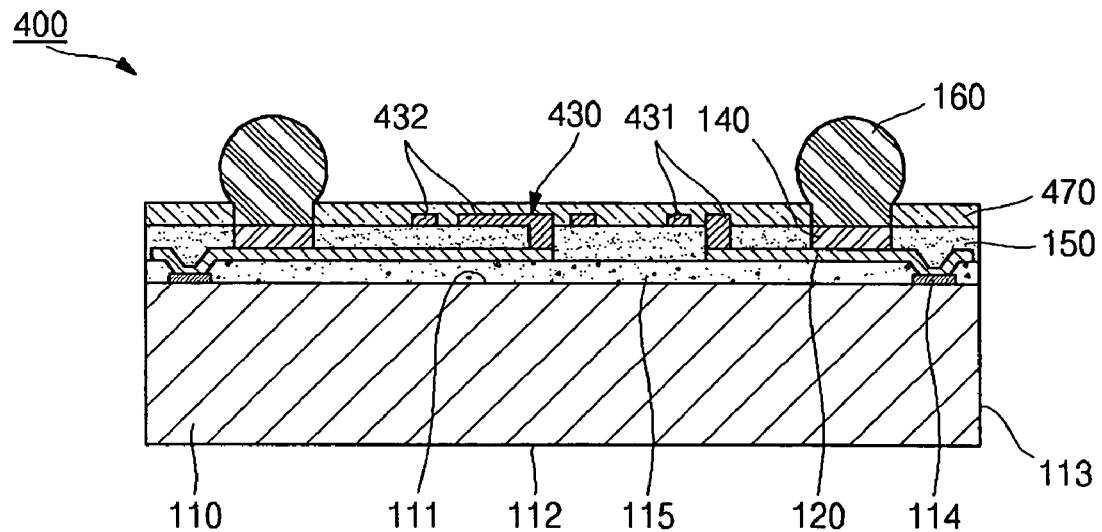
FIG. 4A is a sectional view showing a wafer level chip scale package according to another embodiment of the present invention.
Figure 4B:
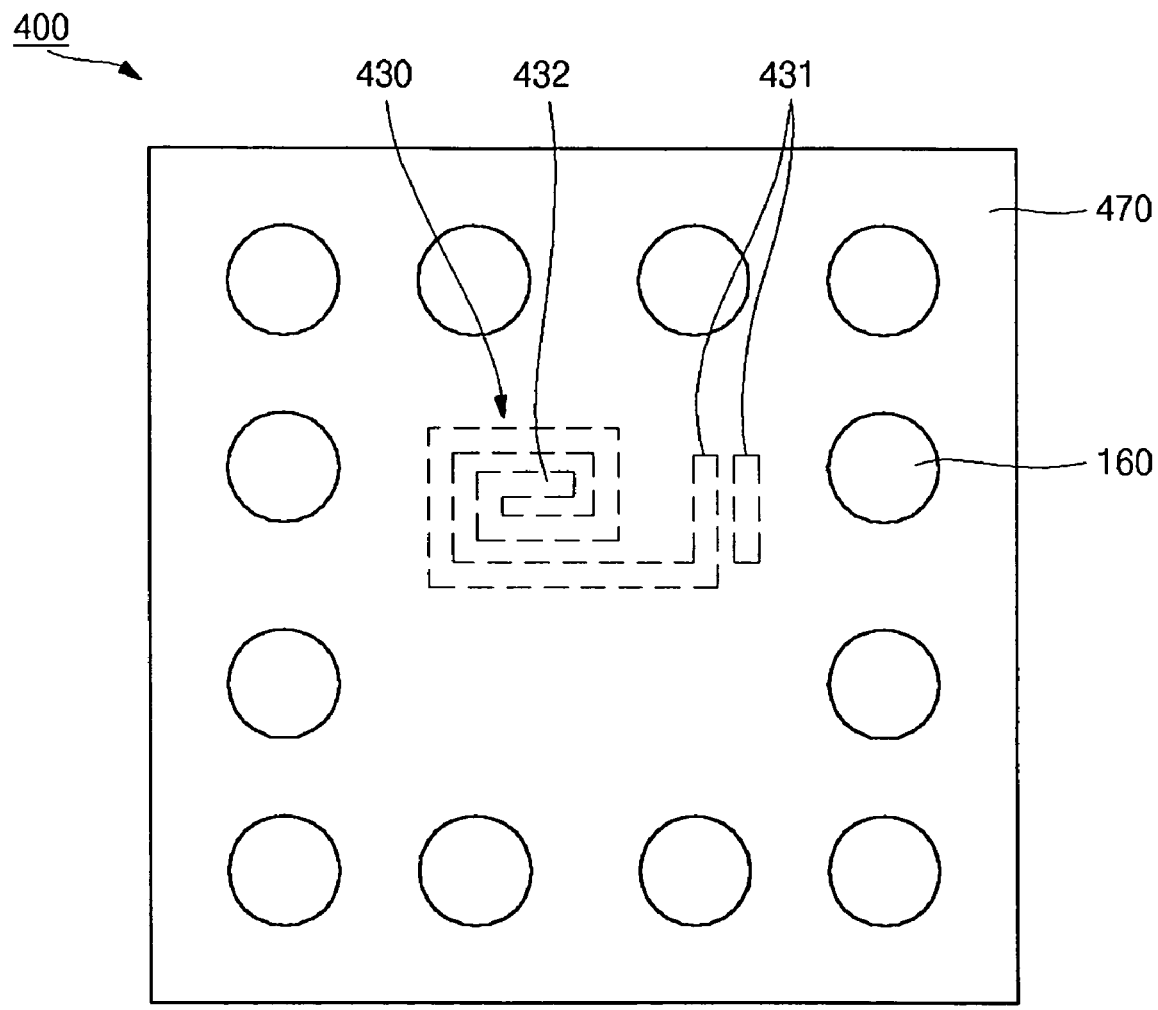
FIG. 4B is a top view of the wafer level chip scale package shown in FIG. 4A.

Referring to FIG. 4A, a sectional view showing a wafer level chip scale package according to another embodiment of the present invention is illustrated and, referring to FIG. 4B, a top view of the wafer level chip scale package shown in FIG. 4A is illustrated.

The package 400 has a structure similar to that of the package 300 shown in FIG. 3 and the difference between them will now be described.

As shown, a third coating layer 470 may be additionally formed on the second layer 150. A first electronic device 430 is formed on the second coating layer 150 and may be any one chosen from a capacitor 431, an inductor 432, and an equivalent thereof, but the type is not limited herein. The first electronic device 430 is electrically connected to the first redistribution layer 120 via the second coating layer 150.

The first electronic device 430 can be realized by a conventional wiring pattern. Particularly, the first electronic device 430 may be formed by sputtering or plating conventional copper, aluminum, or other various alloys on the second coating layer 150 and subjecting it to exposure-to-light, development, and etching. In the drawing, a capacitor 431 and an inductor 432 are shown as the first electronic device 430. Although the first electronic device 430 is coated with the third coating layer 470, such coating is not always necessary. Particularly, the first electronic device 430 may be directly exposed to the exterior.

The third coating layer 470 may be made of any one chosen from mold compound, epoxy resin, and an equivalent thereof, in addition to BCB (benzocyclobutene) and PI (polyimide), but the material is not limited herein. Particularly, the third coating layer 470 may be made of mold compound or liquid epoxy resin so that it can be simply formed using a mold or dispenser without exposure-to-light, development, and etching processes.

A solder ball 160 extends through the third coating layer 470 and is thermally bonded to the first conductive post 140. The first conductive post 140 may have the same surface as the third coating layer 470. In this case, the solder ball 160 does not extend through the third coating layer 470.

The first, second, and third coating layers 115, 150, and 470 have the same width. Particularly, the width of the package 400 is not larger than that of the semiconductor die 110.

Figure 5:
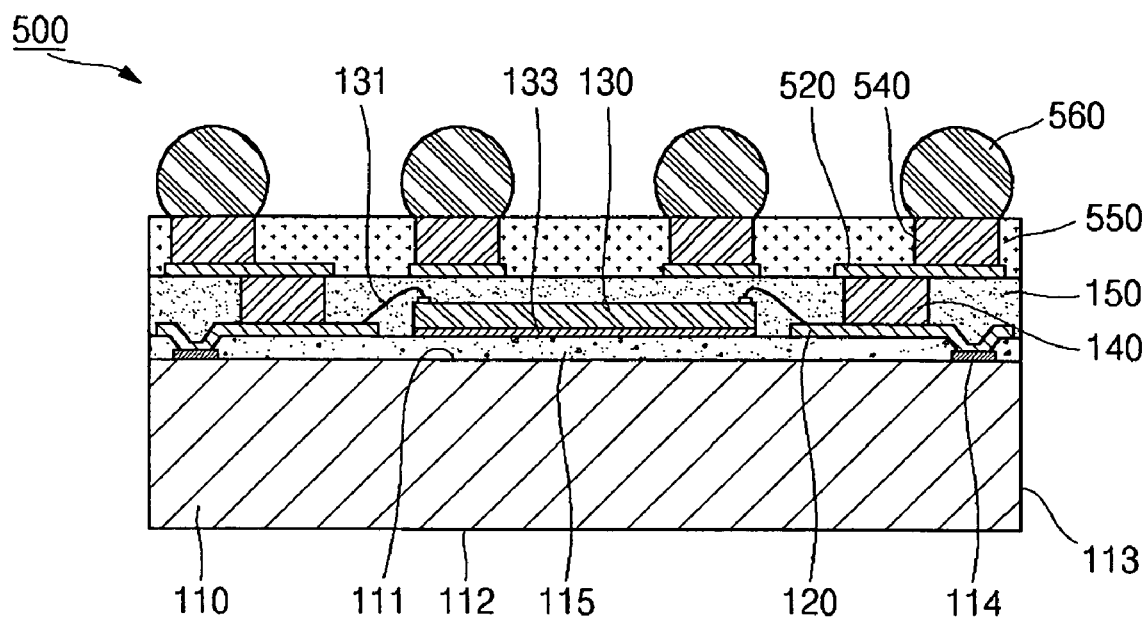
FIG. 5 is a sectional view showing a wafer level chip scale package according to another embodiment of the present invention.

Referring to FIG. 5, a sectional view showing a wafer level chip scale package according to another embodiment of the present invention is illustrated.

The package 500 has a structure similar to that of the package 100 shown in FIG. 1 and the difference between them will now be described.

The first conductive post 140 has the same surface as that of the second coating layer 150. The first conductive post 140 has no solder ball thermally bonded to the surface thereof. Instead, a region of the second redistribution layer 520 is connected to the surface of the first conductive post 140 and another region thereof extends a predetermined distance along the surface of the second coating layer 150. The second redistribution layer 520 may be made of any one chosen from copper (Cu), aluminum (Al), and other various alloys, but the material is not limited herein. The second redistribution layer 520 has a second conductive post 540 formed in a region thereof with a predetermined thickness. The second conductive post 540 is arranged on the second coating layer 150 substantially in a full array. Particularly, the first conductive post 140 is arranged on the first coating layer 115 in a dual or quad type but the second conductive post 540 is arranged on the second coating layer 150 in a full array to secure more input and output terminals. The second conductive post 540 may be made of any one chosen from copper (Cu), aluminum (Al) and other various alloys, but the material is not limited herein.

A third coating layer 550 is additionally formed on the second coating layer 150 to cover the second redistribution layer 520 and the second conductive post 540 and protect them from external environments. The surface of the second conductive post 540 may be exposed to the exterior of the third coating layer 550 so that it can be directly mounted on an external apparatus or a solder ball 560 can be thermally bonded to it. The third coating layer 550 may be made of any one chosen from BCB (benzocyclobutene), PI (polyimide), mold compound, epoxy resin, and an equivalent thereof, but the material is not limited herein. Suitably, the third coating layer 550 is made of mold compound or liquid epoxy resin so that it can be simply formed using a mold or dispenser without exposure-to-light, development, and etching processes.

The first, second, and third coating layers 115, 150, and 550 have the same width as the semiconductor die 110 to realize a true chip scale package. Particularly, the width of the package 500 is not larger than that of the semiconductor die 110.

Figure 5A:
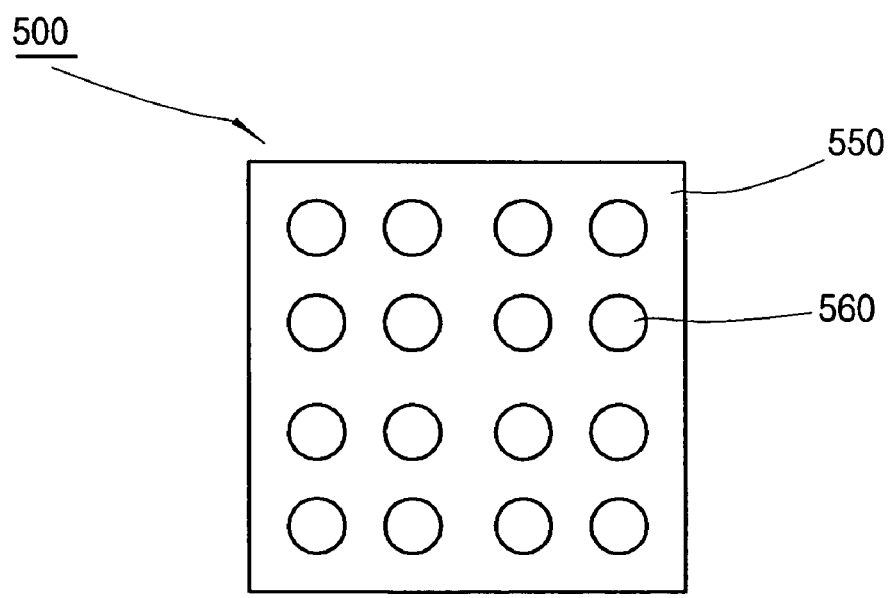
FIG. 5A is a top view of the wafer level chip scale package shown in FIG. 5.

Referring to FIG. 5A, a top view of the wafer level chip scale package shown in FIG. 5 is illustrated.

As shown in FIG. 5A, the solder ball 560 of a wafer level chip scale package 500 may be arrayed with grid array type on the third coating layer 550. Of course, the second conductive post (not shown) must be arrayed with a grid array type for the grid array type of the solder ball 560.

Figure 6:
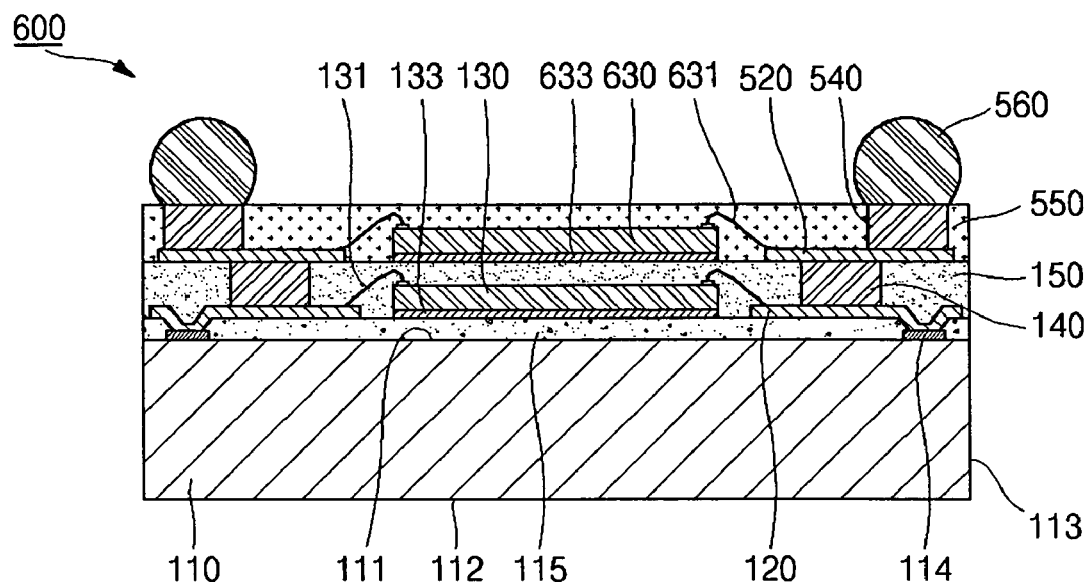
FIG. 6 is a sectional view showing a wafer level chip scale package according to another embodiment of the present invention.

Referring to FIG. 6, a sectional view showing a wafer level chip scale package according to another embodiment of the present invention is illustrated.

The package 600 has a structure similar to that of the packages 100 and 500 shown in FIGS. 1 and 5 and the difference between them will now be described.

As shown, a second redistribution layer 520 and a second conductive post 540 are formed on the second coating layer 150 in a dual or quad type. Particularly, neither the second conductive post 540 nor the solder ball 560 thermally bonded thereto is arranged in a full array.

A second electronic device 630 is bonded to the second coating layer 150 with an adhesive 633 and is electrically connected to the second redistribution layer 520 by a second connection member 631. The second electronic device 630 may be a semiconductor die, such as a conventional memory, a DSP, or a PLC, but the type is not limited herein. The second connection member 631 may be a conductive wire, such as a conventional gold wire, an aluminum wire, or a copper wire, but the material is not limited herein.

The third coating layer 550 covers the second redistribution layer 520, the second conductive post 540, the second electronic device 630, and the second connection member 631 formed on the second coating layer 150. The surface of the second conductive post 540 is exposed to the exterior of the third coating layer 550 so that it can be directly mounted on an external apparatus or a solder ball 560 can be thermally bonded to it. The thickness of the third coating layer 550 is larger than the loop height of the second connection member 631. Otherwise, the second connection member 631 would be exposed to the exterior via the third coating layer 550.

Figure 7:
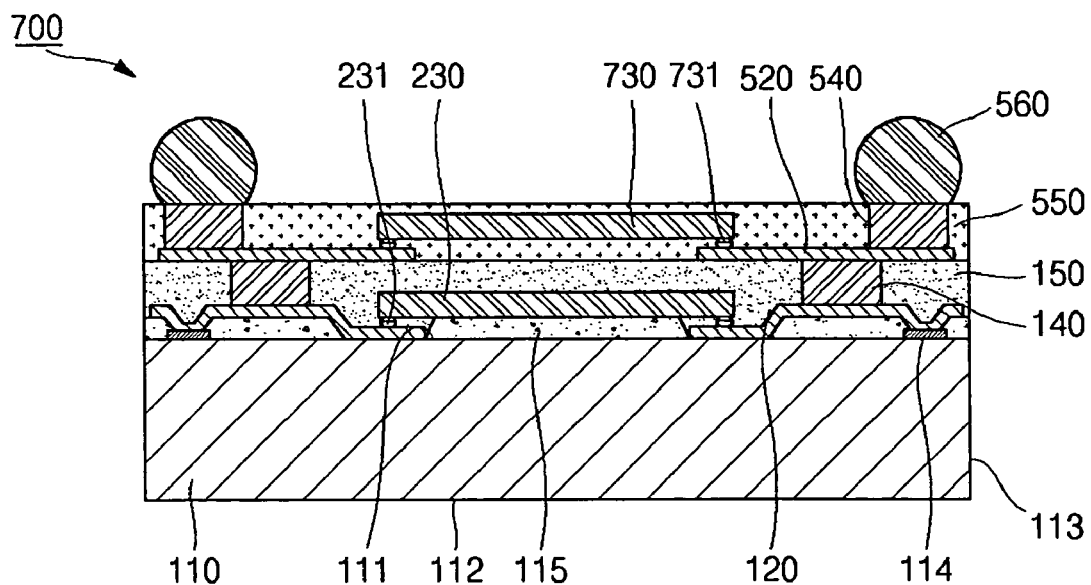
FIG. 7 is a sectional view showing a wafer level chip scale package according to another embodiment of the present invention.

Referring to FIG. 7, a sectional view showing a wafer level chip scale package according to another embodiment of the present invention is illustrated.

The package 700 has a structure similar to that of the packages 200 and 500 shown in FIGS. 2 and 5 and the difference between them will now be described.

As shown, a second electronic device 730 is positioned on the second coating layer 150 without any adhesive. The second electronic device 730 may be a semiconductor die, such as a memory, a DSP, or a PLC, but the type is not limited herein. Although the second electronic device 730 is covered with the third coating layer 550, it may have a region exposed to the exterior of the third coating layer 550.

The second electronic device 730 is electrically and mechanically connected to the second redistribution layer 520 by a conductive bump constituting a second connection member 731. This type of connection is generally referred to as flip chip connection. The conductive bump may be any one chosen from a solder bump, a gold bump, a silver bump, and other various alloys, but the material is not limited herein.

Figure 8:
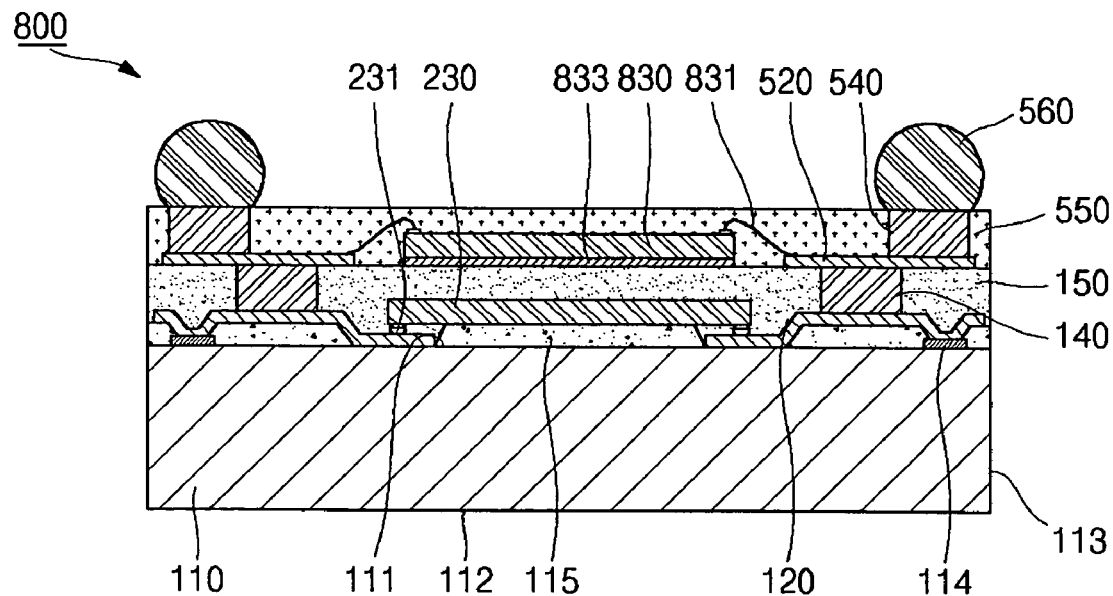
FIG. 8 is a sectional view showing a wafer level chip scale package according to another embodiment of the present invention.

Referring to FIG. 8, a sectional view showing a wafer level chip scale package according to another embodiment of the present invention is illustrated.

The package 800 has a structure similar to that of the packages 600 and 700 shown in FIGS. 6 and 7 and the difference between them will now be described.

As shown, the first electronic device 230 is positioned on the first coating layer 115 and is connected to the first redistribution layer 120 by a conductive bump constituting a first connection member 231. The second electronic device 830 is positioned on the second coating layer 150 by an adhesive 833 and is connected to the second redistribution layer 520 by a conductive wire constituting a second connection member 831. The opposite configuration is also possible. Particularly, the first electronic device 230 positioned on the first coating layer 115 may be connected to the first redistribution layer 120 by a conductive wire constituting a first connection member and the second electronic device 830 positioned on the second coating layer 150 may be connected to the second redistribution layer 520 by a conductive bump constituting a second connection member.

Figure 9:
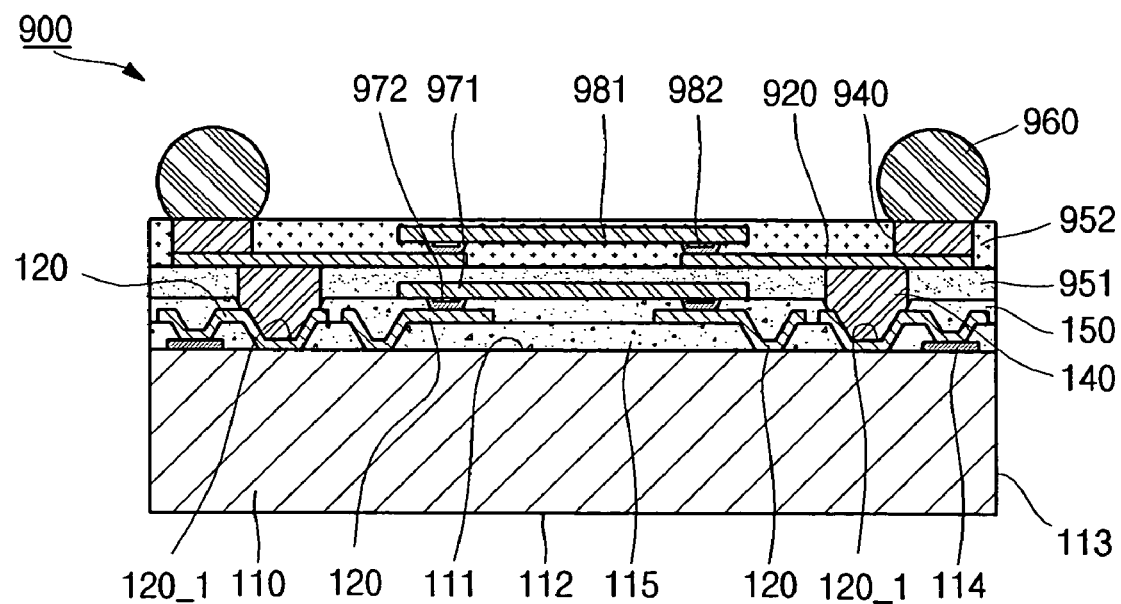
FIG. 9 is a sectional view showing a wafer level chip scale package according to another embodiment of the present invention; and, FIGS. 10A to 10Q are sectional views showing a method for manufacturing a wafer level chip scale package according to the present invention.

Referring to FIG. 9, a sectional view showing a wafer level chip scale package 900 according to another embodiment of the present invention is illustrated.

As shown, a second coating layer 150 is formed on the first coating layer 115 and the first redistribution layer 120 with a predetermined region thereof exposed. Moreover, a under bumped metal (UBM) 120_1 may be formed on the predetermined region of the redistribution layer 120. Particularly, a predetermined region of the first redistribution layer 120 and the UBM 120_1 are exposed, to which a first electronic device 971 and a first conductive post 140 are to be connected. More particularly, the first electronic device 971 positioned on the second coating layer 150 extends through the second coating layer 150 by a first connection member 972 (conductive bump) and is connected to a predetermined region of the first redistribution layer 120. In addition, the first conductive post 140 extends through the second coating layer 150 and is connected to the UBM 120_1.

The second coating layer 150, the first electronic device 971, and the first conductive post 140 are covered with a third coating layer 951. The surface of the first conductive post 140 is exposed to the exterior of the third coating layer 951.

The first conductive post 140 is connected to a region of the surface of the third coating layer 951 and second redistribution layer 920, which extends a predetermined distance along the third coating layer 951, is connected to another region thereof.

A second electronic device 981 is connected to a region of the second redistribution layer 920 via a second connection member 982 (conductive bump) and a second conductive post 940 is formed in another region thereof with a predetermined thickness.

The third coating layer 951, the second electronic device 981, the second connection member 982, and the second conductive post 940 are covered with a fourth coating layer 952. The surface of the second conductive post 940 is exposed to the exterior of the surface of the fourth coating layer 952 so that it can be directly mounted on an external apparatus or a solder ball 960 can be thermally bonded to it.

The fourth coating layer 952 may be made of any one chosen from BCB (benzocyclobutene), PI (polyimide), mold compound, epoxy resin, and an equivalent thereof, but the material is not limited herein. Suitably, the fourth coating layer 952 is made of mold compound or liquid epoxy resin so that it can be simply formed using a mold or dispenser without exposure-to-light, development, and etching processes.

Figure 10A:
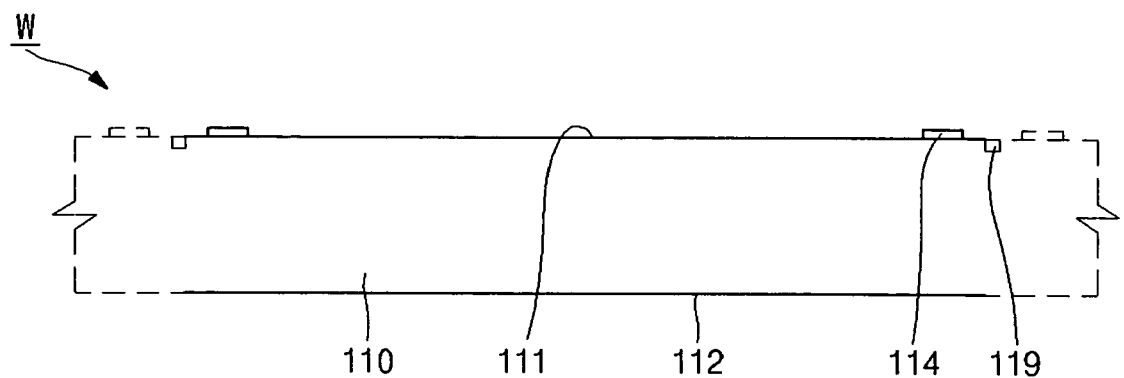
Figure 10B:
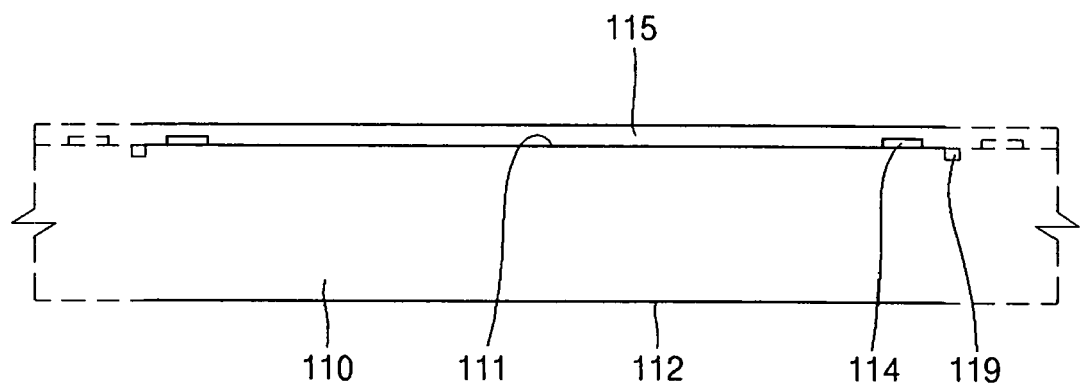
Figure 10C:
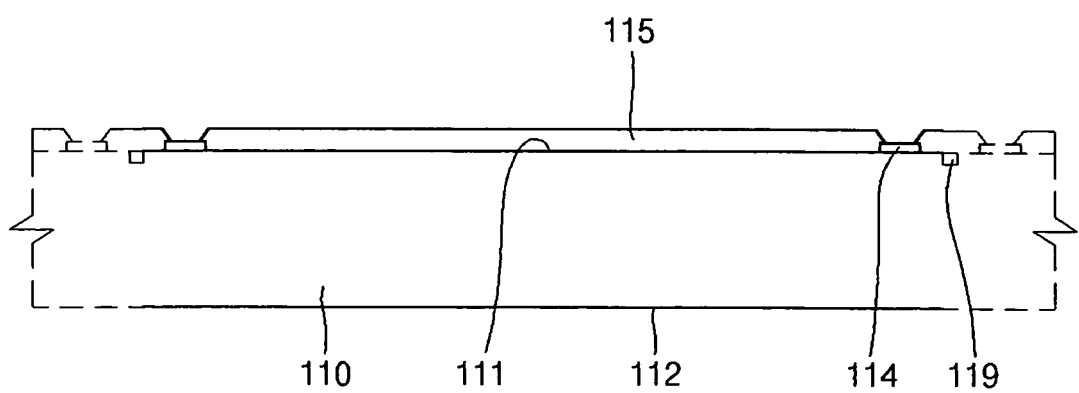
Figure 10D:
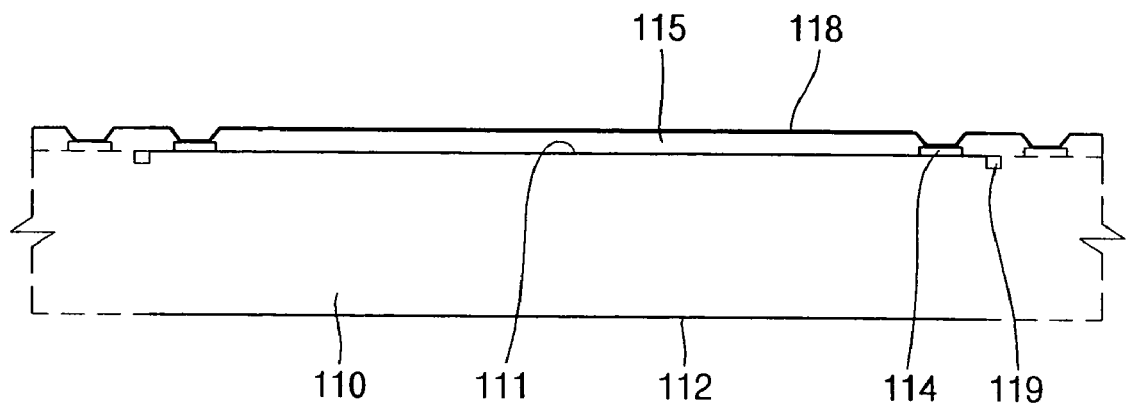
Figure 10E:
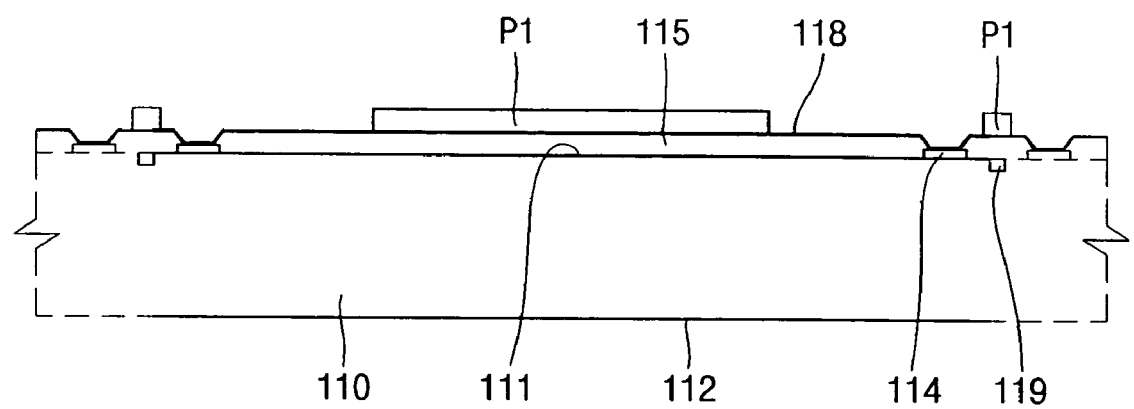
Figure 10F:
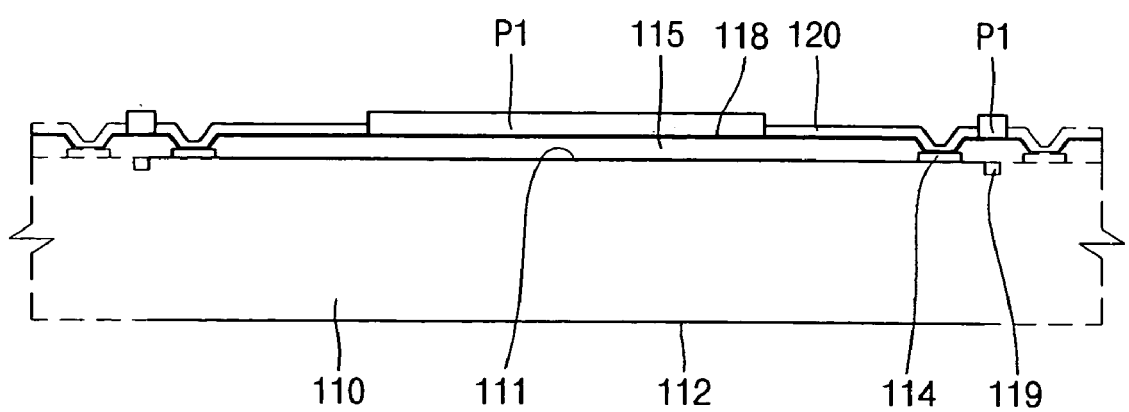
Figure 10G:
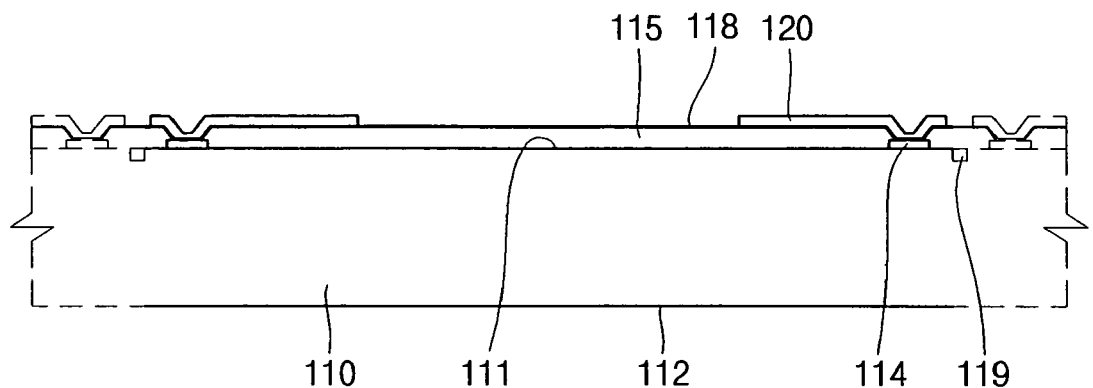
Figure 10H:
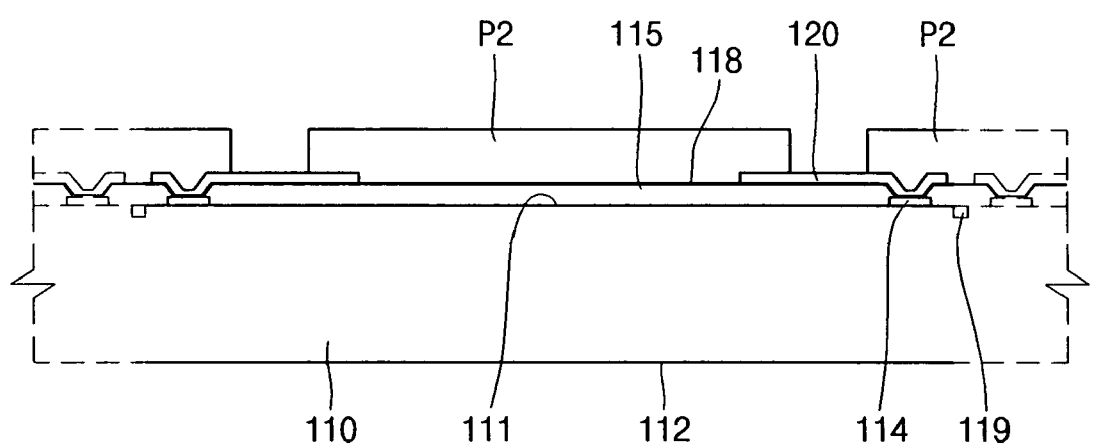
Figure 10I:
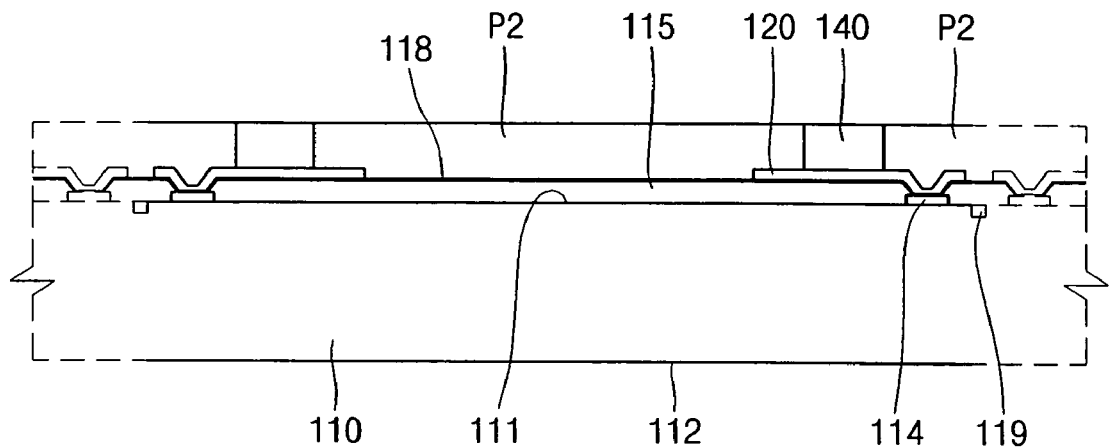
Figure 10J:
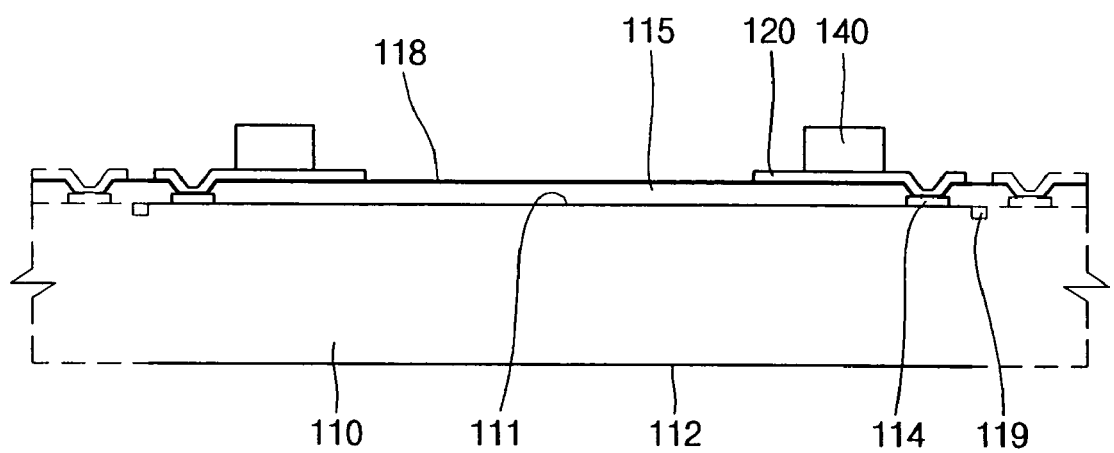
Figure 10K:
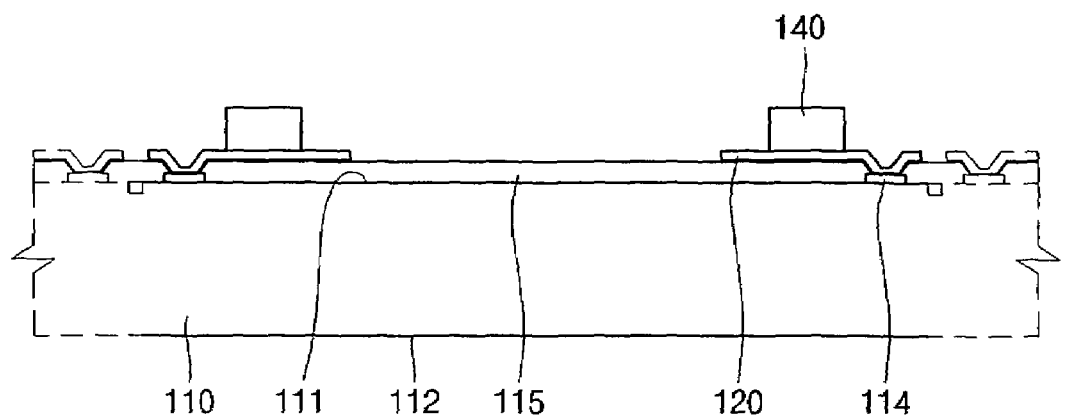
Figure 10L:
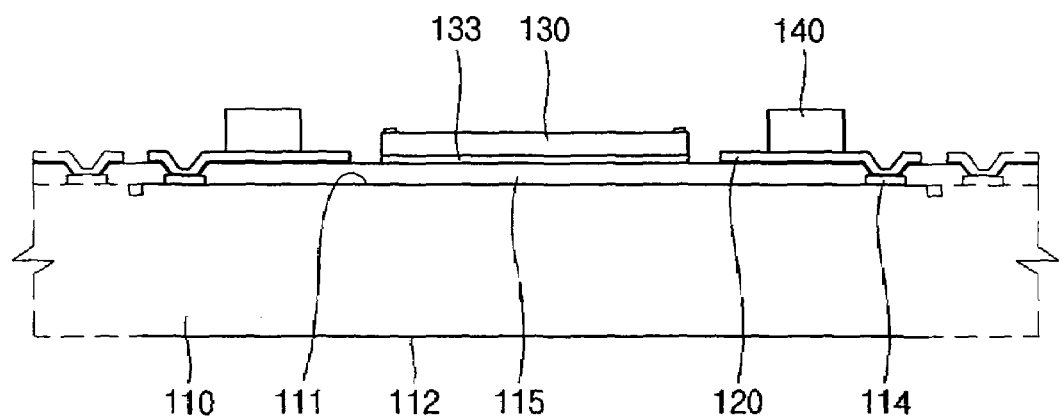
Figure 10M:
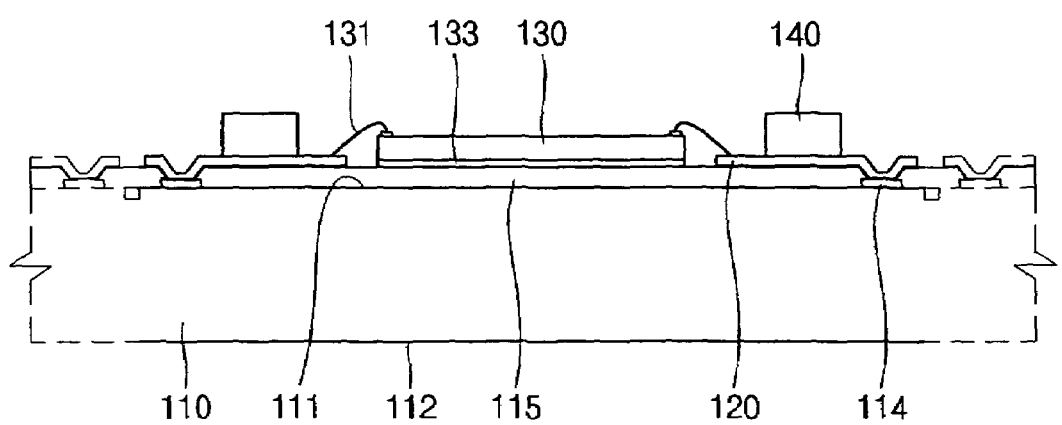
Figure 10N:
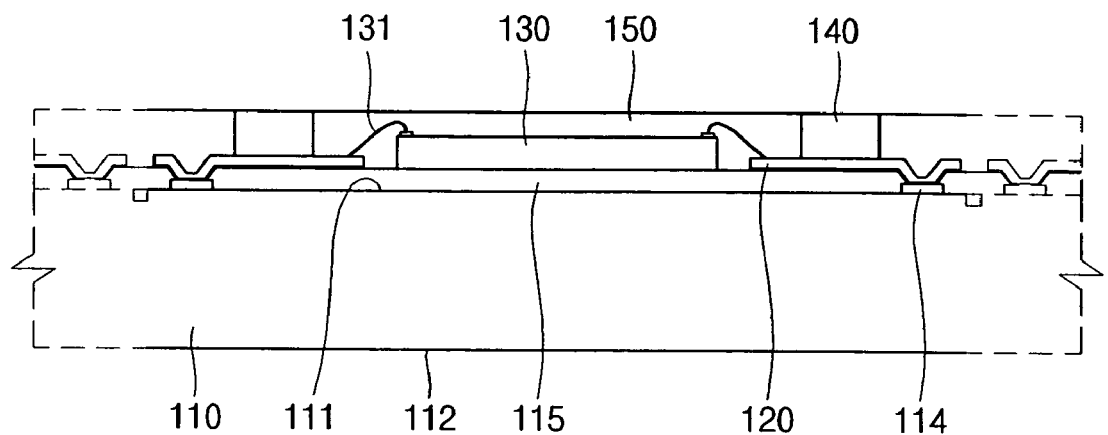
Figure 10O:
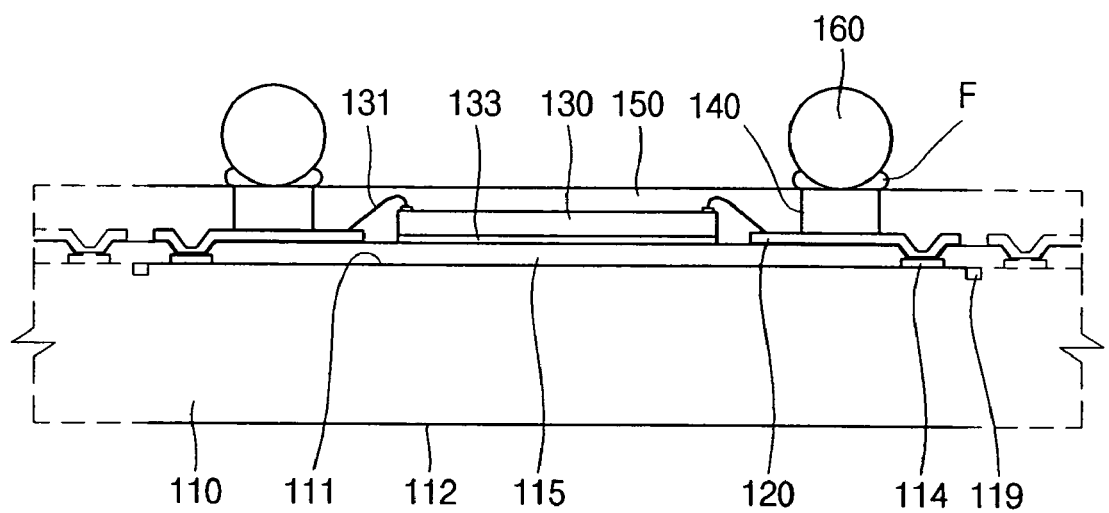
Figure 10P:
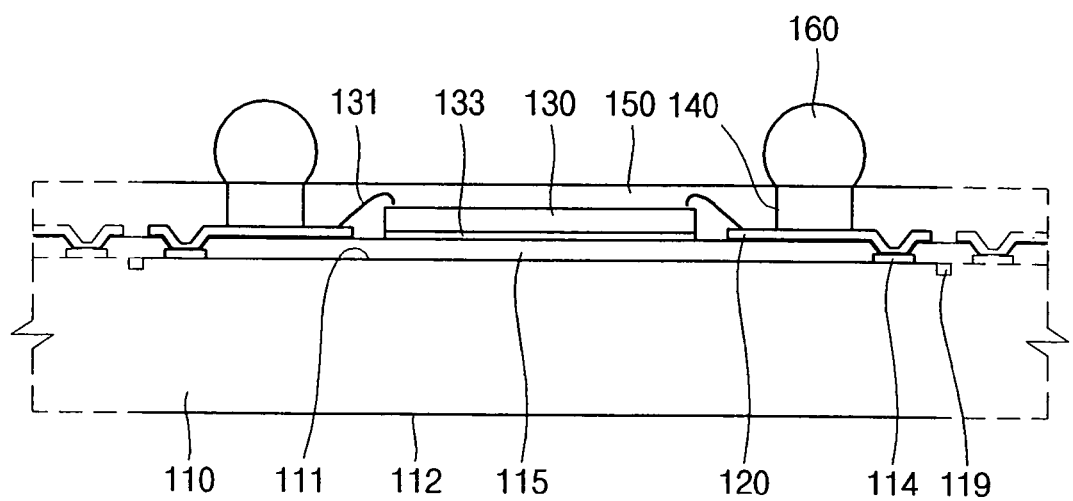
Figure 10Q:
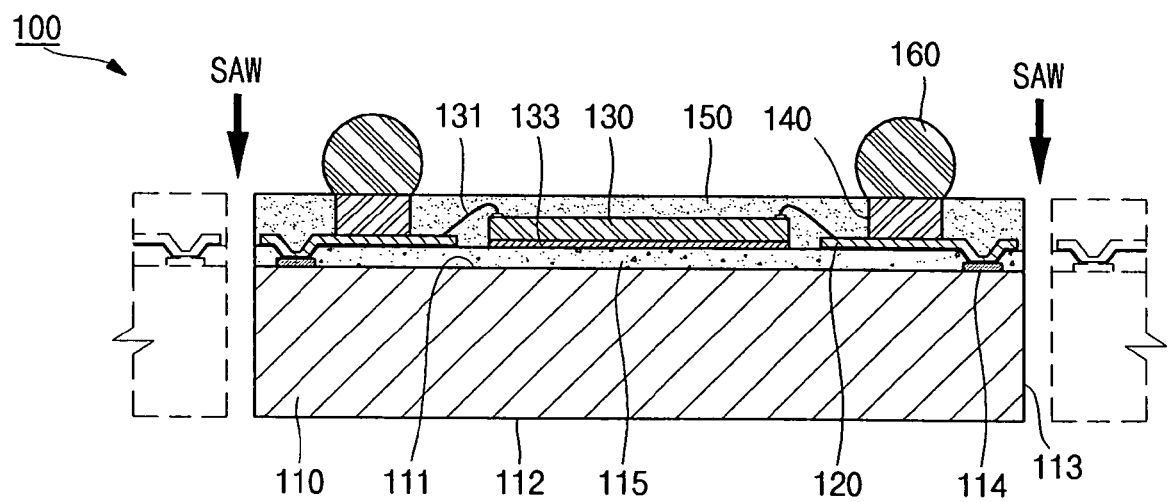

Referring to FIGS. 10A to 10Q, a method for manufacturing a wafer level chip scale package according to the present invention is illustrated.

The method for manufacturing a wafer level chip scale package according to the present invention includes a semiconductor wafer provision operation (FIG. 10A), a first coating layer formation operation (FIGS. 10B and 10C), seed layer and a redistribution layer formation operation (FIGS. 10D to 10G), a conductive post formation operation (FIGS. 10H to 10J), seed layer removing operation (FIG. 10K), an electronic device placement operation (FIG. 10L), a connection operation (FIG. 10M), a second coating layer formation operation (FIG. 10N), a solder ball thermal bonding operation (FIGS. 10O and 10P), and a sawing operation (FIG. 10Q).

In the semiconductor wafer provision operation, as shown in FIG. 10A, a semiconductor wafer W having at least one semiconductor die 110 formed thereon, which has a bond pad 114 delimited by a scribe line 119, is provided. The semiconductor die 110 has a substantially planar first surface 111 and a substantially planar second surface 112 opposing the first surface 111. The first surface has at least one bond pad 114 formed thereon and a scribe line 119 formed on the outer peripheral surface of the bond pad 114.

In the first coating layer formation operation, as shown in FIGS. 10B and 10C, a first coating layer 115 is formed on the entire first surface 111 of the semiconductor die 110 with a predetermined thickness in such a manner that the bond pad 114 is exposed to the exterior of the first coating layer 115.

As shown FIG. 10B, for example, a photosensitive first coating layer 115 is applied to the entire first surface 111 of the semiconductor die 110 and is dried. A mask (not shown) is used to expose the entire semiconductor die 110 to light, except the bond pad 114. As shown in FIG. 10C, the part of the first coating layer 115 corresponding to the bond pad 114, which has not been exposed to light, is developed (or etched) to expose the bond pad 114 to the exterior via the first coating layer 115.

The first coating layer 115 may be made of any one chosen from photosensitive BCB (benzocyclobutene), photosensitive PI (polyimide), and an equivalent thereof, but the material is not limited herein.

Alternatively, a conventional photoresist (not shown) may be used. Particularly, a first coating layer 115 is applied to the entire first surface 111 of the semiconductor die 110 and is dried. A conventional photoresist is applied to the first coating layer 115. A mask is positioned on the photoresist and exposure-to-light and development processes are suitably performed to expose a region of the first coating layer 115 corresponding to the bond pad 114 to the exterior via the photoresist. A suitable etching solution is used to etch the first coating layer 115 exposed to the exterior via the photoresist to remove it. After the bond pad 114 is exposed via the first coating layer 115, the photoresist is removed.

In the redistribution layer formation operation, as shown in FIGS. 10D to 10G, a redistribution layer 120 is formed on the first coating layer 115 in such a manner that it extends a predetermined distance while being connected to the bond pad 114. The operation will now be descried in more detail.

As shown in FIG. 10D, a seed layer 118 is formed on the entire surface of the first coating layer 115 and the bond pad 114 exposed via it with a thickness of a number of micro meters in a non-electrolytic plating method or sputtering. The seed layer 118 may be made of any one chosen from copper, aluminum, nickel, palladium, and other various alloys, but the material is not limited herein.

As shown in FIG. 10E, the seed layer 118 is coated with a photosensitive film P1, which is then subjected to exposure-to-light and development processes using a mask (not shown) to expose a predetermined region thereof in a substantially redistribution layer shape. Particularly, only the region of the photosensitive film P1 in which a redistribution layer 120 is to be formed is removed.

As shown in FIG. 10F, a redistribution layer 120 is formed on the seed layer 118, which has been exposed via the photosensitive film P1, with a predetermined thickness in a sputtering or electrolytic plating method. The redistribution layer 120 may be made of any one chosen from copper (Cu), aluminum (Al), and other various alloys, but the material is not limited herein.

As shown in FIG. 10G, the remaining photosensitive film is removed. Here, the seed layer 118 still exists on the bond pad 114 and the first coating layer 115.

In the conductive post formation operation, as shown in FIGS. 10H to 10J, a conductive post 140 is formed in a region of the redistribution layer 120 with a predetermined thickness. The operation will now be described in more detail.

As shown in FIG. 10H, the surface of the seed layer 118 and redistribution layer 120 are coated with a photosensitive film P2 with a thickness larger than that of the redistribution layer 120. A region of the photosensitive film P2 corresponding to a predetermined region of the redistribution layer 120 is removed to expose the predetermined region of the redistribution layer 120 to the exterior. Particularly, a conventional mask (not shown) is used to expose the photosensitive film P2 to light and a development solution is used to develop the region not exposed to light so that a predetermined region of the redistribution layer 120 is exposed to the exterior.

As shown in FIG. 10I, a conductive post 140 is formed on the redistribution layer 120, which has been exposed to the exterior via the photosensitive film P2, with a predetermined thickness in a sputtering or electrolytic plating method. The conductive post 140 may be made of copper and other various alloys, but the material is not limited herein.

As shown in FIG. 10J, all photosensitive film P2 formed on the seed layer 118 and redistribution layer 120 is removed to completely expose the redistribution layer 120 and the conductive post 140 to the exterior.

In the seed layer removing operation, as shown FIG. 10K, the seed layer 118 which is not corresponding with the redistribution layer 120 is removed to expose the first coating layer 115 to the exterior. In other words, the seed layer 118 positioned in the region having no redistribution layer 120 is removed in exposure-to-light, development, and etching processes using another photosensitive film (not shown) Particularly, the seed layer 118 in the region having no redistribution layer 120 is removed to avoid any unnecessary short circuit in the redistribution layer 120.

In the electronic device placement operation, as shown in FIG. 10L, an electronic device 130 is bonded to the first coating layer 115 with an adhesive 133. The electronic device 130 may be a semiconductor die, such as a conventional memory, a DSP, or a PLL, but the type is not limited herein.

In the connection operation, as shown in FIG. 10M, the electronic device 130 and the redistribution layer 120 are connected to each other with a connection member 131. For example, an end of a conductive wire is connected to the electronic device 130 and the other end thereof is connected to the redistribution layer 120.

In the second coating layer formation operation, as shown in FIG. 10N, a second coating layer 150 is formed on the surface of the first coating layer 115, the redistribution layer 120, the conductive post 140, the electronic device 130, and the connection member 131 in such a manner that the surface of the conductive post 140 is exposed to the exterior of the second coating layer 150. The second coating layer 150 may be made of any one chosen from BCB (benzocyclobutene), PI (polyimide), mold compound, epoxy resin, and an equivalent thereof, but the material is not limited herein. Suitably, the second coating layer 150 is made of mold compound or liquid epoxy resin so that it can be simply formed using a mold or dispenser without exposure-to-light, development, and etching processes.

In the solder ball thermal bonding operation, as shown in FIGS. 10O and 10P, a solder ball 160 is thermally bonded to the surface of the conductive post 140 exposed via the second coating layer 150. Particularly, as shown in FIG.

10O, the surface of the conductive post 140 exposed via the second coating layer 150 is dotted with a predetermined amount of flux F. A solder ball 160 is placed on the flux F and is introduced into a furnace at a temperature of substantially 150-250° C. Then, the flux F volatilizes and disappears. The solder ball 160 melts and takes a substantially spherical shape on the surface of the conductive post 140 due to the surface tension. As the solder ball 160 is cooled, as shown in FIG. 10P, it is firmly fastened to the conductive post 140. The operation for thermally bonding the solder ball 160 may be omitted. This is because the conductive post 140 can be directly mounted on an external apparatus via a solder paste without the solder ball 160.

In the sawing operation, as shown in FIG. 10Q, the semiconductor wafer W, the first coating layer 115, and the second coating layer 150, which correspond to the scribe line 119, are sawn together to complete a separate chip scale package 100. For example, a diamond blade is used to successively saw the second coating layer 150, the first coating layer 115, and the semiconductor wafer W to complete an individual chip scale package 100.

Following the above operations, laser marking or ink marking is performed on the second surface 112 of the semiconductor die 110. Various electrical tests and an appearance inspection are then performed to finish a product.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. A wafer level chip scale package comprising:
    a semiconductor die comprising a first surface comprising at least one bond pad formed thereon and a first coating layer formed on the outer peripheral edge of the bond pad, a second surface opposing the first surface, and a third surface positioned along the periphery of the first and second surfaces;
    a first redistribution layer along a surface of the first coating layer and being connected to the bond pad;
    a first electronic device positioned on the surface of the first coating layer and connected to the first redistribution layer by a first connection member;
    a first conductive post formed on the first redistribution layer; and
    a second coating layer formed on the surface of the first coating layer, the first redistribution layer, the first electronic device, the first connection member, and the first conductive post in such a manner that a surface of the first conductive post is exposed to the exterior.

2. The wafer level chip scale package as claimed in claim 1, wherein the first coating layer is made of a photosensitive material.

3. The wafer level chip scale package as claimed in claim 1, wherein the first coating layer is made of any one chosen from a group consisting of BCB (benzocyclobutene) and PI (polyimide).

4. The wafer level chip scale package as claimed in claim 1, wherein the first connection member is any one chosen from a group consisting of a conductive wire and a conductive bump.

5. The wafer level chip scale package as claimed in claim 1, wherein the first conductive post is made of copper.

6. The wafer level chip scale package as claimed in claim 1, wherein the second coating layer is made of any one chosen from a group consisting of benzocyclobutene, polyimide, mold compound, and epoxy resin.

7. The wafer level chip scale package as claimed in claim 1, wherein the second and third surfaces of the semiconductor die are exposed to the exterior.

8. The wafer level chip scale package as claimed in claim 1, wherein the first electronic device is bonded to the surface of the first coating layer with an adhesive and the first connection member comprises a conductive wire.

9. The wafer level chip scale package as claimed in claim 1, wherein the first electronic device is any one chosen from a group consisting of a resistor, a capacitor, and an inductor and is formed on a surface of the second coating layer using a conductive film and being connected to the first redistribution layer.

10. The wafer level chip scale package as claimed in claim 9, wherein a third coating layer is formed on the surface of the second coating layer to cover the first electronic device.

11. The wafer level chip scale package as claimed in claim 1, wherein the first conductive post has a solder ball thermally bonded thereto.

12. The wafer level chip scale package as claimed in claim 1, wherein the first and second coating layers have a lateral surface which is flush with the third surface of the semiconductor die.

13. The wafer level chip scale package as claimed in claim 1, further comprising:
    a second redistribution layer on a surface of the second coating layer and being connected to the first conductive post;
    a second conductive post connected to the second redistribution layer; and
    a third coating layer formed on the surface of the second coating layer, the second redistribution layer, and the second conductive post in such a manner that a surface of the second conductive post is exposed to the exterior.

14. The wafer level chip scale package as claimed in claim 13, wherein the third coating layer is made of any one chosen from a group consisting of benzocyclobutene, polyimide, mold compound, and epoxy resin.

15. The wafer level chip scale package as claimed in claim 13, wherein the second conductive post has a solder ball thermally bonded thereto.

16. The wafer level chip scale package as claimed in claim 13, wherein a second electronic device is positioned on the surface of the second coating layer and is connected to the second redistribution layer by a second connection member.

17. The wafer level chip scale package as claimed in claim 13, wherein the first, second, and third coating layers have a lateral surface which is flush with the third surface of the semiconductor die.

18. A wafer level chip scale package comprising:
    a semiconductor die comprising a first surface comprising at least one bond pad formed thereon and a first coating layer formed on the outer peripheral edge of the bond pad, a second surface opposing the first surface, and a third surface positioned along the periphery of the first and second surfaces;
    a first redistribution layer along a surface of the first coating layer and being connected to the bond pad;
    a second coating layer formed on the surface of the first coating layer and the first redistribution layer;
    a first electronic device positioned on a surface of the second coating layer and connected to the first redistribution layer by a first connection member;

a first conductive post formed on the first redistribution layer;

a third coating layer formed on the surface of the second coating layer, the first electronic device, and the first conductive post in such a manner that a surface of the first conductive post is exposed to the exterior;

a second redistribution layer on a surface of the third coating layer and contacting the first conductive post;

a second electronic device connected to the second redistribution layer by a second connection member;

a second conductive post formed on the second redistribution layer; and a fourth coating layer formed on the surface of the third coating layer, the second redistribution layer, the second electronic device, the second connection member, and the second conductive post in such a manner that a surface of the second conductive post is exposed to the exterior.

19. The wafer level chip scale package as claimed in claim 18, wherein the second conductive post has a solder ball thermally bonded thereto.

20. A wafer level chip scale package comprising:

a semiconductor die comprising a first surface comprising bond pads formed thereon and a first coating layer formed on the outer peripheral edges of the bond pads, a second surface opposing the first surface, and a third surface positioned along the periphery of the first and second surfaces;

a first redistribution layer along a surface of the first coating layer and being connected to the bond pads;

a first electronic device positioned on the surface of the first coating layer and connected to the first redistribution layer by conductive wires;

conductive posts formed on the first redistribution layer;

a second coating layer formed on the surface of the first coating layer, the first redistribution layer, the first electronic device, the conductive wires, and the conductive posts in such a manner that surfaces of the conductive posts are exposed to the exterior, wherein the first and second coating layers have a lateral surface which is flush with the third surface of the semiconductor die; and solder balls thermally bonded to the conductive posts.

* * * * *